United States Patent
Son

(10) Patent No.: US 8,441,182 B2
(45) Date of Patent: May 14, 2013

(54) ORGANIC LIGHT EMITTING DIODE DISPLAY

(75) Inventor: Hyun-Chul Son, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 326 days.

(21) Appl. No.: 12/978,967

(22) Filed: Dec. 27, 2010

(65) Prior Publication Data

US 2011/0164019 A1 Jul. 7, 2011

(30) Foreign Application Priority Data

Jan. 7, 2010 (KR) .................. 10-2010-0001339

(51) Int. Cl.
 *H01J 1/62* (2006.01)
(52) U.S. Cl.
 USPC .......................................... 313/504; 313/506
(58) Field of Classification Search ............. 313/498, 313/504, 506; 345/211, 76–82; 315/169.1, 315/169.3
 See application file for complete search history.

(56) References Cited

U.S. PATENT DOCUMENTS

| | | | |
|---|---|---|---|
| 6,940,476 B2 * | 9/2005 | Ko ............................... | 345/76 |
| 2005/0116232 A1 | 6/2005 | Kim et al. | |
| 2008/0121886 A1 | 5/2008 | Shin | |
| 2008/0191613 A1 | 8/2008 | Goh et al. | |

FOREIGN PATENT DOCUMENTS

| | | |
|---|---|---|
| KR | 10-2003-0069434 A | 8/2003 |
| KR | 10-2005-0115705 A | 12/2005 |
| KR | 10-2006-0001717 | 1/2006 |
| KR | 10-2006-0021211 | 3/2006 |
| KR | 10-2007-0032880 | 3/2007 |
| KR | 20070056304 A | 6/2007 |
| KR | 10-2008-0080712 | 9/2008 |

* cited by examiner

*Primary Examiner* — Vip Patel
(74) *Attorney, Agent, or Firm* — Robert E. Bushnell, Esq.

(57) ABSTRACT

An organic light emitting diode display that includes a substrate defined with a plurality of pixels, an organic light emitting diode formed at each pixel with a first electrode, an organic emissive layer, and a second electrode, a driving circuit with a thin film transistor electrically connected to the organic light emitting diode, and a wire electrically connected to the driving circuit with a gate line, a data line, and a common power line to transmit external signals to the driving circuit. The data line and the common power line are formed in different geometric planes.

20 Claims, 3 Drawing Sheets

ORGANIC LIGHT EMITTING DIODE DISPLAY

RELATED APPLICATIONS

This application claims priority to and the benefit of Korean Patent Application No. 10-2010-0001339 filed in the Korean Intellectual Property Office on Jan. 7, 2010, the entire contents of which are incorporated herein by reference.

BACKGROUND

1. Field

The general inventive concept relates to an organic light emitting diode display.

2. Description of the Related Art

An active matrix organic light emitting diode display includes an organic light emitting diode with an anode, an organic emissive layer, and a cathode, and a thin film transistor and a wire for driving the organic light emitting diode. Holes and electrons are injected into the organic emissive layer from the anode and the cathode, and are combined with each other therein so as to generate excitons. When the excitons drop from an excited state to a ground state, energy is generated to emit light. The organic light emitting diode displays an image based on the emitted light.

The above information disclosed in this Related Art Section is only for enhancement of understanding of the background of the described technology and therefore it may contain information that does not form the prior art that is already known in this country to a person of ordinary skill in the art.

SUMMARY

The described technology has been made in an effort to provide an organic light emitting diode display having advantages of lowering the inferiority rate and achieving the high resolution and definition.

An exemplary embodiment provides an organic light emitting diode display including a substrate defined with a plurality of pixels, and an organic light emitting diode formed at each pixel with a first electrode, an organic emissive layer, and a second electrode. A driving circuit with a thin film transistor is electrically connected to the organic light emitting diode. A wire is electrically connected to the driving circuit to transmit external signals thereto. The wire has a gate line, a data line, and a common power line. The data line and the common power line are formed on different planes.

The data line and the first electrode may be formed on the same plane. The data line and the first electrode may contain the same material. The data line and the first electrode may contain a transparent conductive material.

The common power line and source and drain electrodes of the thin film transistor may be formed on the same plane. The common power line and the source and drain electrodes may contain the same material.

When viewed from the front side, the common power line and the data line may be spaced apart from each other by a distance. When viewed from the front side, the common power line and the data line may be overlapped with each other.

The gate line may be formed in a first direction, while the data line and the common power line are formed in a second direction crossing the first direction. The gate line, the data line, and the common power line may be formed on different planes.

An interlayer insulating layer may cover the gate line while being overlaid with the common power line and the source and drain electrodes of the thin film transistor. A planarization layer may cover the common power line and the source and drain electrodes while being overlaid with the data line and the first electrode.

The horizontal width of the respective pixels is 30 μm or less, and the distance between the common power line and the source and drain electrodes is 6 μm or more.

With an organic light emitting diode display according to an exemplary embodiment, the data line and the common power line have a width that is sufficiently large so as to prevent the voltage drop while preventing the horizontal short. Accordingly, the inferiority rate of the organic light emitting diode display decreases so that the pixel width can be reduced with advantages of achieving the high resolution and definition.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
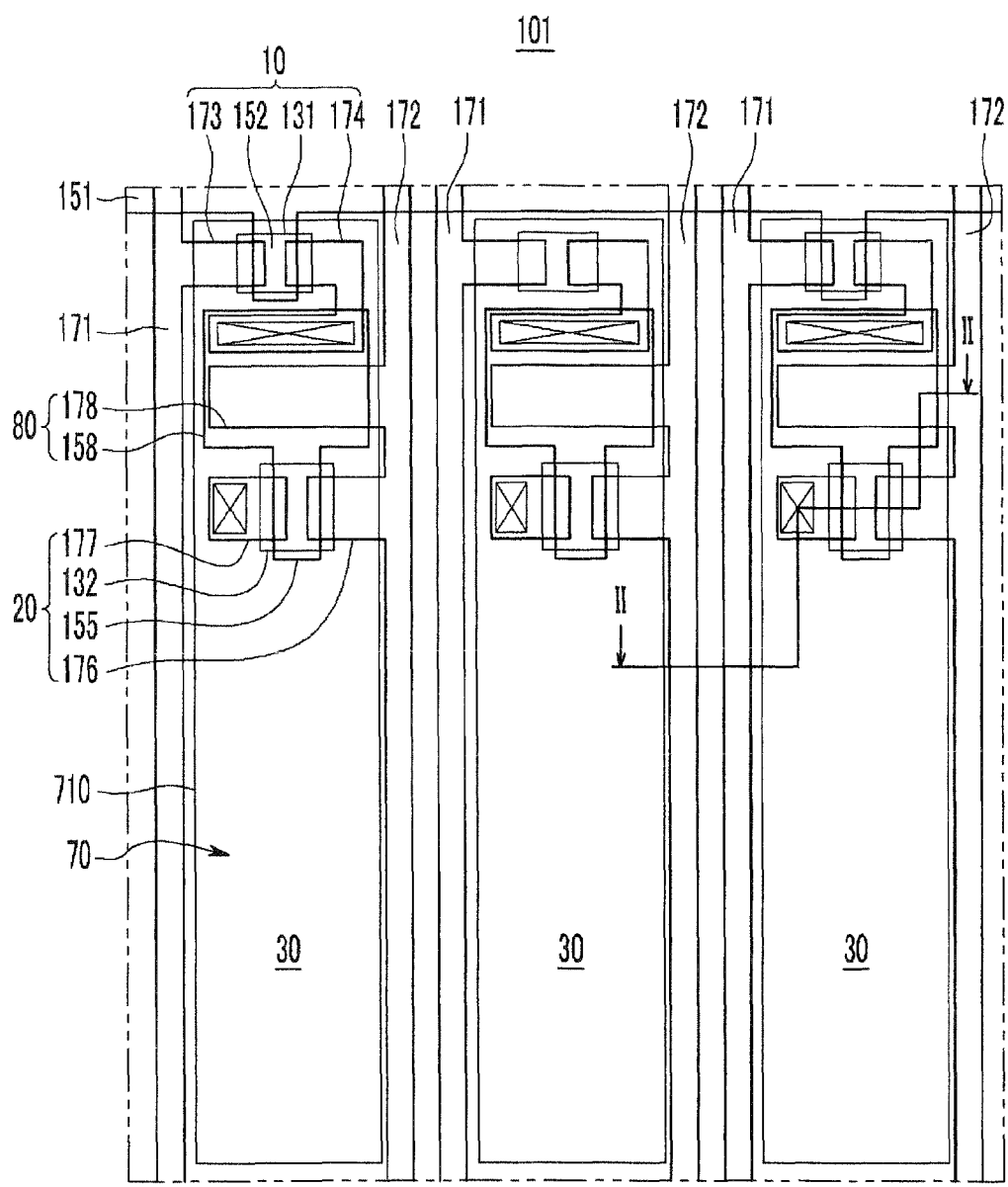
FIG. 1 is a layout view of an organic light emitting diode display according to an exemplary embodiment.

The exemplary embodiments will be described more fully hereinafter with reference to the accompanying drawings, in which the exemplary embodiments are shown. As those skilled in the art would realize, the described embodiments may be modified in various different ways, all without departing from the spirit or scope of the present invention. Parts that are irrelevant to the description are omitted in order to clearly describe the exemplary embodiment, and like reference numerals designate like elements throughout the specification.

Furthermore, as the size and thickness of the respective constituent elements shown in the drawings are arbitrarily illustrated for better comprehension and ease of description, the present invention is not necessarily limited to as illustrated. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In order to achieve high resolution and definition in a conventional active matrix organic light emitting diode display it is necessary with the organic light emitting diode display to reduce the size of a pixel as a minimum image displaying unit. The pixel size may be reduced by shortening the width of the thin film transistor electrode or the wire placed within the pixel, or the distance between the thin film transistor and the wire.

However, if the thin film transistor electrode or the wire is reduced in width, the resistance increases so that a voltage drop (IR drop) may occur, causing non-uniform luminance. Furthermore, if the distance between the thin film transistor and the wire is reduced, a horizontal short may occur therebetween.

That is, with the conventional pixel size reduction methods, as the inferiority rate of the organic light emitting diode display increases while damaging the reliability thereof, there is a limit in achieving the high resolution and definition. If a plurality of thin film transistors and capacitors are provided at a pixel so as to improve the characteristics of the organic light emitting diode display, it becomes further difficult to achieve the high resolution and definition.

An organic light emitting diode display according to an exemplary embodiment will now be described with reference to FIG. 1 and FIG. 2.

Figure 2:
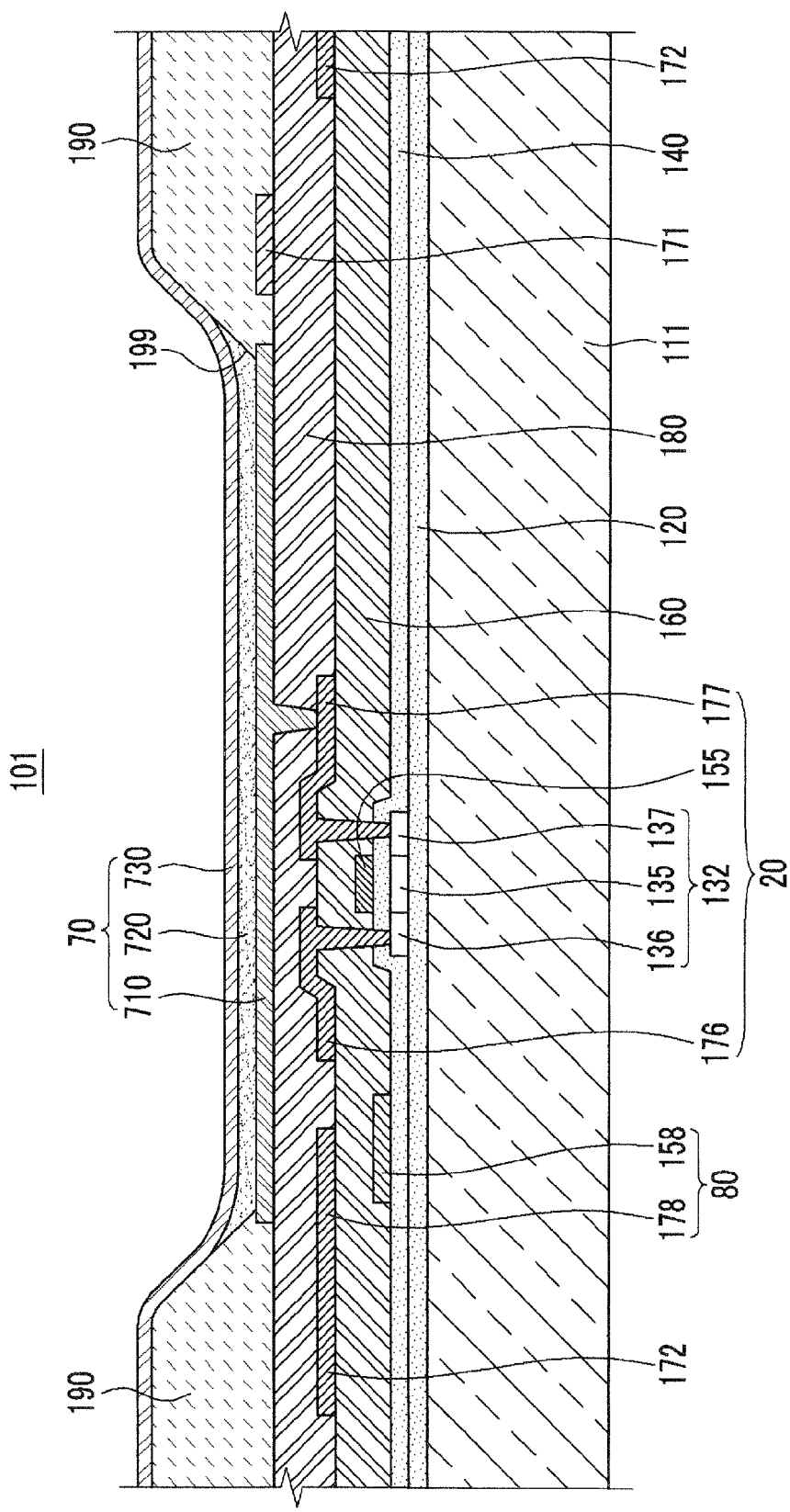
FIG. 2 is a cross-sectional view of the organic light emitting diode display taken along the II-II line of FIG. 1.

FIG. 1 is a layout view of an organic light emitting diode display according to an exemplary embodiment, and FIG. 2 is a cross-sectional view of the organic light emitting diode display taken along the II-II line of FIG. 1.

Illustrated in FIG. 1 and FIG. 2 is an active matrix (AM) type of organic light emitting diode display 101 with a 2 Tr-1 Cap structure, where a pixel 30 is provided with two thin film transistors (TFT) 10 and 20 and a capacitor 80. However, the present invention or the present exemplary embodiment is not limited thereto. With the organic light emitting diode display 101, the pixel 30 may be provided with three or more transistors and two or more capacitors, or may be structured with a separate wire. A pixel 30 is a minimum image displaying unit, and the organic light emitting diode display 101 displays images through a plurality of pixels 30.

As shown in FIG. 1 and FIG. 2, the organic light emitting diode display 101 according to the present exemplary embodiment includes organic light emitting diodes (OLED) 70 formed at the plurality of pixels 30 defined on a substrate 111, respectively, driving circuits 10, 20, and 80 electrically connected to the light emitting diodes 70 to control the light emission thereof, and wires 151, 171, and 172 electrically connected to the driving circuits 10, 20, and 80 to transmit external signals thereto.

The driving circuits 10, 20, and 80 may include a switching thin film transistor 10, a driving thin film transistor 20, and a capacitor 80. The wires 151, 171, and 172 include gate lines 151 arranged in a first direction, and data lines 171 and common power lines 172 crossing the gate lines 151 in an insulated manner. Therefore, the gate lines 151 are perpendicular to the data lines 171 and the common power lines 172. Further, the gate lines 151, the data lines 171 and the common power lines 172 are in different geometric planes. Also, the data lines 171 and the common power lines 172 run parallel to each other. Here, a pixel is defined by taking the gate lines 151 and the data and common power lines 171 and 172 as a boundary, but it is not limited thereto.

The organic light emitting diode 70 is formed by sequentially depositing a first electrode (referred to hereinafter as the "pixel electrode") 710, an organic emissive layer 720, and a second electrode (referred to hereinafter as the "common electrode") 730. At least one pixel electrode 710 is formed at each pixel 30 such that the organic light emitting diode display 101 has a plurality of pixel electrodes 710 spaced apart from each other by a distance. Here, the pixel electrode 710 functions as an anode being a hole injection electrode, and the common electrode 730 functions as a cathode being an electron injection electrode. However, the exemplary embodiment is not limited to the above, and depending upon the way of driving the organic light emitting diode display 101, the pixel electrode 710 may function as a cathode, and the common electrode 730 may function as an anode.

Holes and electrons injected into the organic emissive layer 720 are combined with each other so as to form excitons, and when the excitons drop from an excited state to a ground state, the organic emissive layer 720 emits light.

The capacitor 80 includes a pair of capacitor plates 158 and 178 interposing an interlayer insulating layer 160 therebetween. The interlayer insulating layer 160 functions as a dielectric. The capacitance is determined by the charges charged at the capacitor 80 and the voltages applied to the pair of capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting the pixel 30 to be excited. The switching gate electrode 152 is connected to the gate line 151, and the switching source electrode 173 is connected to the data line 171. The switching drain electrode 174 is spaced apart from a switching source electrode 173 by a distance, and is connected to one of the capacitor plates 158.

The driving thin film transistor 20 applies the power for exciting the organic emissive layer 720 of the organic light emitting diode 70 within the selected pixel 30 to the pixel electrode 710. The driving gate electrode 155 is connected to the capacitor plate 158 connected with the switching drain electrode 174. The driving source electrode 176 and the other capacitor plate 178 are connected to the common power line 172, respectively. The driving drain electrode 177 is connected to the pixel electrode 710 of the organic light emitting diode 70 through a contact hole.

With the above structure, the switching thin film transistor 10 is operated by the gate voltage applied to the gate line 151 so as to transmit the data voltage applied to the data line 171 to the driving thin film transistor 20. A voltage corresponding to the difference between the common voltage applied from the common power line 172 to the driving thin film transistor 20 and the data voltage transmitted from the switching thin film transistor 10 is stored at the capacitor 80, and the current corresponding to the voltage stored at the capacitor 80 flows to the organic light emitting diode 70 through the driving thin film transistor 20 so that the organic light emitting diode 70 emits light.

The deposition structure of an organic light emitting diode display 101 according to the present exemplary embodiment will now be described in detail with reference to FIG. 2.

Illustrated in FIG. 2 are the organic light emitting diode 70, the driving thin film transistor 20, the capacitor 80, the data line 171, and the common power line 172, and detailed description is made based thereon. As the switching semiconductor layer 131, the switching gate electrode 152, and the switching source and drain electrodes 173 and 174 of the switching thin film transistor 10 are the same in deposition structure as the driving semiconductor layer 132, the driving gate electrode 155, and the driving source and drain electrodes 176 and 177 of the driving thin film transistor 20, detailed description thereof will be omitted.

With the present exemplary embodiment, the substrate main body 111 may be formed with an insulating substrate based on glass, quartz, ceramic, or plastic. However, the exemplary embodiment is not limited thereto, and the substrate main body 111 may be formed with a metallic substrate based on stainless steel or other metals.

A buffer layer 120 is formed on the substrate main body 111. The buffer layer 120 has a role of preventing the intrusion of impure elements into a target surface while flattening the surface, and may be formed with various materials capable of playing such a role. For example, the buffer layer 120 may be formed with silicon nitride (SiNx), silicon oxide (SiO$_2$), or silicon oxynitride (SiOxNy). However, such a buffer layer 120 is not necessarily required, and may be omitted considering the kinds and processing conditions of the substrate main body 111.

The driving semiconductor layer 132 is formed on the buffer layer 120. The driving semiconductor layer 132 may be formed with various semiconductor materials such as polycrystalline silicon and amorphous silicon.

The driving semiconductor layer 132 includes a channel region 135 where no impurities are doped, and source and drain regions 136 and 137 placed at both sides of the channel region 135 while being (p+)-doped. For example, the (p+) dopant ionic material may be boron (B), and in this case, B$_2$H$_6$ may be used as such a material.

However, the exemplary embodiment is not limited thereto, and the source and drain regions 136 and 137 may be doped with various materials. Furthermore, with the present exemplary embodiment, a PMOS thin film transistor based on P-type impurities is used for the driving thin film transistor 20, but it is possible to use an NMOS or CMOS thin film transistor therefore.

A gate insulating layer 140 based on silicon nitride or silicon oxide is formed on the driving semiconductor layer 132. The driving gate electrode 155, a gate line 151 (shown in FIG. 1), and a first capacitor plate 158 are formed on the gate insulating layer 140. The driving gate electrode 155 is overlapped with a least a part of the driving semiconductor layer 132, and particularly, with the channel region 135.

The interlayer insulating layer 160 is formed on the gate insulating layer 140 such that it covers the driving gate electrode 155. As with the gate insulating layer 140, the interlayer insulating layer 160 is formed with silicon nitride or silicon oxide. The gate insulating layer 140 and the interlayer insulating layer 160 have contact holes exposing the source and drain regions 136 and 137 of the driving semiconductor layer 132.

The driving source electrode 176, the driving drain electrode 177, the common power line 172, and the second capacitor plate 178 are formed on the interlayer insulating layer 160. The driving source electrode 176 and the driving drain electrode 177 are connected to the source and drain regions 136 and 137 of the driving semiconductor layer 132 through contact holes, respectively.

In this way, a driving thin film transistor 20 with the driving semiconductor layer 132, the driving gate electrode 155, the driving source electrode 176, and the driving drain electrode 177 is formed. However, the structure of the driving thin film transistor 20 is not limited to the above, and may be modified in various ways.

A planarization layer 180 is formed on the interlayer insulating layer 160 such that it covers the driving source electrode 176, the driving drain electrode 177, and the common power line 172. The planarization layer 180 may be formed with a polyacryl or polyimide-based organic material. The planarization layer 180 has a contact hole exposing the driving drain electrode 177.

The pixel electrode 710 is formed on the planarization layer 180 such that it is connected to the driving drain electrode 177 through the contact hole of the planarization layer 180. With the present exemplary embodiment, the data line 171 is formed on the planarization layer 180.

A pixel definition layer 190 is formed on the planarization layer 180 such that it covers the pixel electrode 710 and the data line 171. The pixel definition layer 190 has an opening 199 exposing the pixel electrode 710 such that it covers the area except for the opening 199. The pixel definition layer 199 may be formed with a polyacryl or polyimide-based resin.

The organic emissive layer 720 is formed on the pixel electrode 710 within the opening 199 of the pixel definition layer 190, and the common electrode 730 is formed on the pixel definition layer 190 and the organic emissive layer 720. The pixel electrode 710, the organic emissive layer 720, and the common electrode 730 form an organic light emitting diode 70.

The organic emissive layer 720 is formed with a low or high molecular organic material. The organic emissive layer 720 may have a multi-layered structure with at least one of an emissive layer, a hole injection layer (HIL), a hole transport layer (HTL), an electron transport layer (ETL), and an electron injection layer (EIL). For example, the hole injection layer (HIL) being an anode is disposed on the pixel electrode 710, and is sequentially overlaid with the hole transport layer (HTL), the emissive layer, the electron transport layer (ETL), and the electron injection layer (EIL).

With the present exemplary embodiment, the organic emissive layer 720 is formed only within the opening 199 of the pixel definition layer 190, but the exemplary embodiment is not limited thereto. Within the opening 199 of the pixel definition layer 190, at least one of sub-layers of the organic emissive layer 720 may be disposed between the pixel definition layer 190 and the common electrode 730 as well as on the pixel electrode 710. Specifically, the hole injection layer (HIL), the hole transport layer (HTL), the electron transport layer (ETL), and the electron injection layer (EIL) of the organic emissive layer 720 may be formed at the area other than the opening 199 by way of an open mask, and the emissive layer of the organic emissive layer 720 may be formed at the respective openings 199 through a fine metal mask (FMM).

The pixel electrode 710 may be formed with a transparent conductive material such as indium tin oxide. The common electrode 730 may be formed with a metallic reflection layer containing at least one material selected from lithium (Li), calcium (Ca), lithium fluoride/calcium (LiF/Ca), lithium fluoride/aluminum (LiF/Al), aluminum (Al), silver (Ag), magnesium (Mg), and gold (Au). Accordingly, the organic light emitting diode display 101 according to the present exemplary embodiment is formed as a rear emissive type where the organic emissive layer 720 emits light in the direction of the pixel electrode 710. However, the exemplary embodiment is not limited thereto.

In this way, with the present exemplary embodiment, the common power line 172 and the source and drain electrodes 173, 174, 176, and 177 of the driving and switching thin film transistors 10 and 20 are formed on the same plane over the interlayer insulating layer 160. That is, the common power line 172 and the source and drain electrodes 173, 174, 176, and 177 are formed through the same process with the same material.

The data line 171 and the pixel electrode 710 are formed on the same plane over the planarization layer 160. That is, the data line 171 and the pixel electrode 710 may be formed through the same process with the same material. The data line 171 may be formed with a transparent conductive material. That is, with the present exemplary embodiment, the data line 171 and the common power line 172 are placed on different planes. As the data line 171 and the common power line 172 placed adjacent to each other at neighboring pixels 30 are placed on different planes, they are differently processed in separate manners. Accordingly, it becomes possible for each of the data line 171 and the common power line 172 neighboring each other to be formed with a suitable width while the possible horizontal short therebetween is prevented.

The above process will now be described more specifically.

The data and common power lines and the source and drain electrodes of the thin film transistors are conventionally formed on the same plane through the same process. That is, many constituent elements are disposed on the same plane within each pixel, and with this structure, if the pixel width is reduced so as to achieve high resolution and definition, the distance between these elements becomes so small so as to cause a horizontal short. Such a horizontal short mostly occurs between the data line and the common power line neighboring each other. In order to prevent the horizontal short, the line width of the data line and the common power line may be reduced, but in that case, non-uniform luminance may result due to the voltage drop.

By contrast, with the present exemplary embodiment, as the data line 171 is formed on a different plane from that of the common power line 172 and the source and drain electrodes 173, 174, 176, and 177, the possible horizontal short between the data line 171 and the common power line 172 can be prevented in principle. Furthermore, with the plane on which the data line 171, the common power line 172, and the source and the drain electrodes 173, 174, 176, and 177 are formed, there is room for forming the data line 171 and securing the distance thereof to the common power line 172. Accordingly, the data line 171 and the common power line 172 may have a width that is sufficiently large so as to minimize the voltage drop.

That is, with the organic light emitting diode display 101 according to the present exemplary embodiment, the horizontal short failure can be minimized, and the non-uniform luminance due to the voltage drop can be prevented.

With the present exemplary embodiment, the data line 171 connected to the signal wire and being less sensitive to the voltage drop is formed on the same plane as that of the pixel electrode 710, instead of the common power line 172 connected to the power wire and largely influencing the emissive characteristic. As the data line 171 is formed with the same transparent conductive material as that of the pixel electrode 710, it can fluently function as a data line even if the resistance is relatively high.

It is illustrated and described with the present exemplary embodiment that two thin film transistors and one capacitor are placed within each pixel, but it is possible with the exemplary embodiment for each pixel to be provided with three or more thin film transistors and two or more capacitors. If the thin film transistors and the capacitors disposed within each pixel are increase in number, the arrangement thereof becomes complicated. In this case, the application of the present exemplary embodiment makes it possible to minimize the inferiority rate and effectively prevent the luminance non-uniformity.

For example, it is possible with the VGA-level organic light emitting diode display 101 where the horizontal width of each pixel is 30 µm or less for the common power line 172 and the data line 171 to be dimensioned in width to be 6 µm or more and 3 µm or more, respectively, while the common power line 172 is spaced apart from the source and drain electrodes 173, 174, 175, and 176 by a distance of 6 µm or more, thereby preventing the voltage drop.

Figure 3:
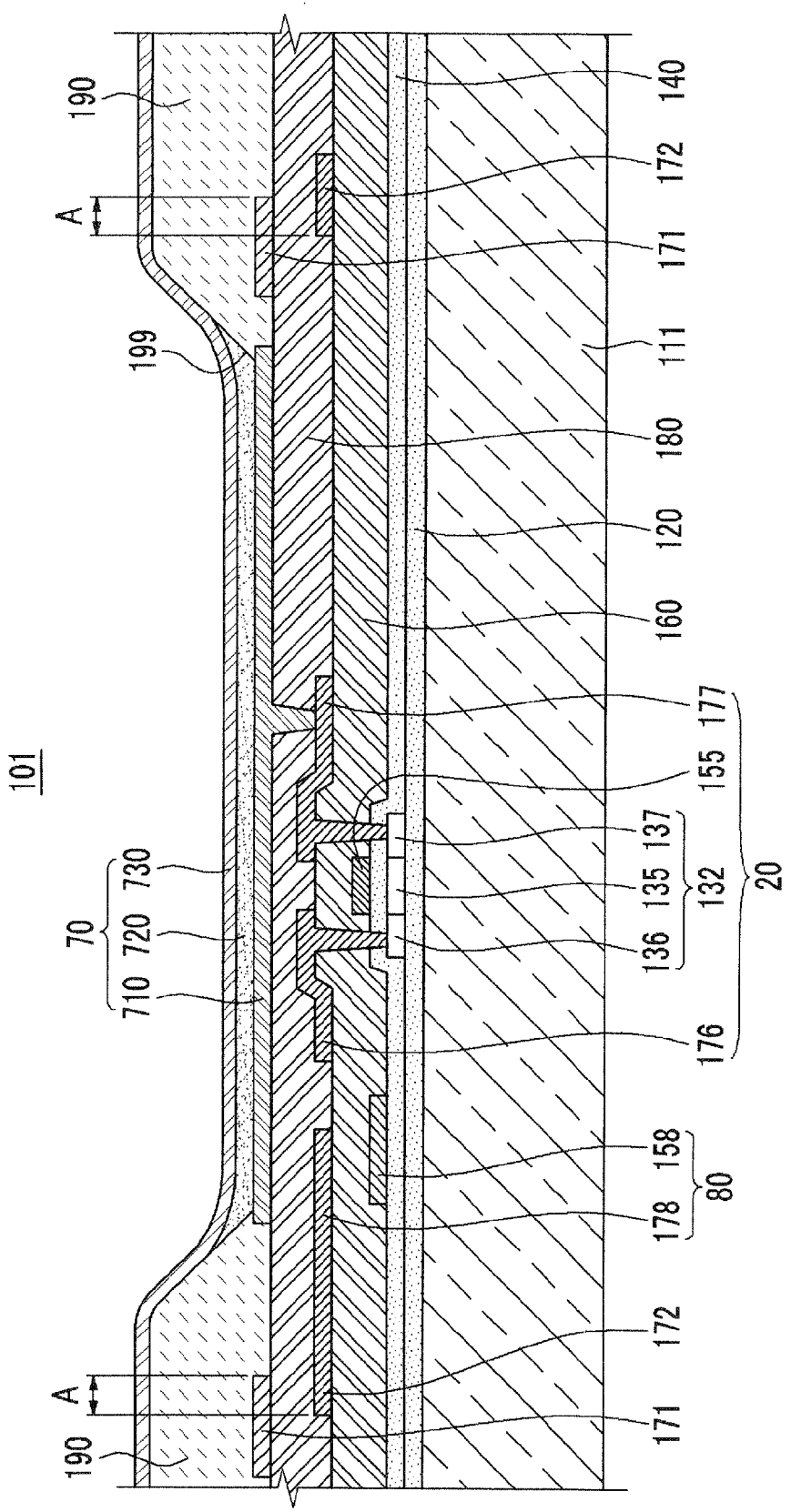
FIG. 3 is a cross-sectional view of an organic light emitting diode display according to another exemplary embodiment.

The structure where the data line 171 and the common power line 172 are not overlapped with each other when viewed from the front side is illustrated in FIG. 1 and FIG. 2, but the exemplary embodiment is not limited thereto. With another exemplary embodiment, as shown in FIG. 3, the data line 171 and the common power line 172 may be overlapped with each other at an area A. With this structure, as it is possible to further reduce the width of the pixel 30, it is advantageous in achieving the high definition and resolution.

The exemplary embodiment will be now described in detail by way of examples. The examples are given only for illustrating the exemplary embodiment, and the exemplary embodiment is not limited thereto.

EXAMPLES

Wires were formed on the same plane such that they were spaced apart from each other by y a distance of 4 µm, 6 µm, and 8 µm, respectively. The rate of inferiority where the horizontal short occurred was checked, and the results are listed in Table 1.

TABLE 1

| Wire distance [µm] | Inferiority rate [%] |
|---|---|
| 4 | 2.08 |
| 6 | 1.20 |
| 8 | 1.10 |

As listed in Table, it turned out that when the wire distance was 4 µm, the inferiority rate was somewhat high at 2.08%, and when the wire distance was 6 µm and 8 µm, the inferiority rate was low at 1.20% and 1.10%, respectively. That is, with the present exemplary embodiment, when the data line 171 and the common power line 172 are formed on different geometric planes while maintaining the distance between the constituent elements formed on the same plane to be minimally 6 µm, the horizontal short failure can be effectively prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
a substrate defined with a plurality of pixels;
an organic light emitting diode formed at each pixel with a first electrode, an organic emissive layer, and a second electrode;
a driving circuit with a thin film transistor electrically connected to the organic light emitting diode; and
a wire electrically connected to the driving circuit to transmit external signals thereto, the wire having a gate line, a data line, and a common power line
wherein the data line and the common power line are formed on different planes.

2. The organic light emitting diode display of claim 1, wherein the data line and the first electrode are formed on the same plane.

3. The organic light emitting diode display of claim 2, wherein the data line and the first electrode contain the same material.

4. The organic light emitting diode display of claim 3, wherein the data line and the first electrode contain a transparent conductive material.

5. The organic light emitting diode display of claim 2, wherein the common power line and source and drain electrodes of the thin film transistor are formed on the same plane.

6. The organic light emitting diode display of claim 5, wherein the common power line and the source and drain electrodes contain the same material.

7. The organic light emitting diode display of claim 1, wherein the common power line and the data line are spaced apart from each other by a distance.

8. The organic light emitting diode display of claim 1, wherein when viewed from the front side, the common power line and the data line overlap each other.

9. The organic light emitting diode display of claim 1, wherein the gate line is formed in a first direction, and the data line and the common power line are formed in a second direction crossing the first direction, while the gate line, the data line, and the common power line are formed in different planes.

10. The organic light emitting diode display of claim 9, wherein an interlayer insulating layer covers the gate line while being overlaid with the common power line and source and drain electrodes of the thin film transistor, and a planarization layer covers the common power line and the source and drain electrodes while being overlaid with the data line and the first electrode.

11. The organic light emitting diode display of claim 9, wherein the horizontal width of the respective pixels is 30 μm or less, and the distance between the common power line and the source and drain electrodes is 6 μm or more.

12. An organic light emitting diode display, comprising:
a substrate defined with a plurality of pixels;
an organic light emitting diode formed at each pixel with a first electrode, an organic emissive layer, and a second electrode;
a driving circuit with a thin film transistor electrically connected to the organic light emitting diode; and
a wire electrically connected to the driving circuit to transmit external signals thereto, the wire having a gate line, a data line, and a common power line,
wherein the data line, the gate line and the common power line exist in different geometric planes with the data line and common power line running parallel to each other and the gate line running perpendicular to the gate line and the common power line, and
wherein the common power line and the data line are spaced apart from each other by a distance equal to or greater than 6 μm.

13. The organic light emitting diode display of claim 12, wherein the data line and the first electrode are composed of the same material.

14. The organic light emitting diode display of claim 13, wherein the data line and the first electrode contain a transparent conductive material.

15. The organic light emitting diode display of claim 13, wherein the common power line and source and drain electrodes of the thin film transistor are formed on the same geometric plane.

16. The organic light emitting diode display of claim 15, wherein the common power line and the source and drain electrodes contain the same material.

17. The organic light emitting diode display of claim 12, wherein the common power line and the data line are spaced apart from each other by a distance equal to or greater than 6 μm and less than or equal to 8 μm.

18. The organic light emitting diode display of claim 12, wherein the common power line and the data line overlap each other.

19. The organic light emitting diode display of claim 12, wherein an interlayer insulating layer covers the gate line while being overlaid with the common power line and source and drain electrodes of the thin film transistor, and a planarization layer covers the common power line and the source and drain electrodes while being overlaid with the data line and the first electrode.

20. The organic light emitting diode display of claim 12, wherein the horizontal width of the respective pixels is 30 μm or less, and the distance between the common power line and the source and drain electrodes is 6 μm or more.

* * * * *